United States Patent
Saito et al.

(10) Patent No.: US 9,136,351 B2
(45) Date of Patent: Sep. 15, 2015

(54) ELECTRIC POWER SEMICONDUCTOR DEVICE AND MANUFACTURING METHOD OF THE SAME

(71) Applicant: KABUSHIKI KAISHA TOSHIBA, Tokyo (JP)

(72) Inventors: Wataru Saito, Himeji Hyogo (JP); Syotaro Ono, Tatsuno Hyogo (JP); Toshiyuki Naka, Yokohama Kanagawa (JP); Shunji Taniuchi, Nomi Ishikawa (JP); Hiroaki Yamashita, Himeji Hyogo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 14/465,493

(22) Filed: Aug. 21, 2014

(65) Prior Publication Data

US 2014/0363938 A1 Dec. 11, 2014

Related U.S. Application Data

(62) Division of application No. 13/600,616, filed on Aug. 31, 2012.

(30) Foreign Application Priority Data

Feb. 27, 2012 (JP) ................................ 2012-040208

(51) Int. Cl.
*H01L 29/06* (2006.01)
*H01L 29/66* (2006.01)
(Continued)

(52) U.S. Cl.
CPC ...... *H01L 29/66712* (2013.01); *H01L 29/0634* (2013.01); *H01L 29/0653* (2013.01); (Continued)

(58) Field of Classification Search
CPC ............ H01L 29/0634; H01L 29/0653; H01L 29/7811; H01L 29/7802; H01L 29/66712; H01L 29/66719
USPC ........................................................ 438/268
See application file for complete search history.

(56) References Cited

U.S. PATENT DOCUMENTS 6,551,909 B1 * 4/2003 Fujihira ........................ 438/510
6,844,592 B2 1/2005 Yamaguchi et al.
(Continued)

FOREIGN PATENT DOCUMENTS

JP 2000040822 A 2/2000
JP 2000208527 A 7/2000
(Continued)

OTHER PUBLICATIONS

Japanese Office Action dated Jun. 25, 2014, filed in Japanese counterpart Application No. 2012-0402082, 5 pages (with translation).
(Continued)

*Primary Examiner* — Charles Garber
*Assistant Examiner* — Grant Withers
(74) *Attorney, Agent, or Firm* — Patterson & Sheridan, LLP

(57) ABSTRACT

A manufacturing method of an electric power semiconductor device includes following processes. A plurality of first second conductivity type impurity implantation layers are formed in a surface of a second semiconductor layer of a first conductivity type. A first trench is formed between a first non-implantation region and one of the plurality of first second conductivity type impurity implantation layers. An epitaxial layer of the first conductivity type is formed and covers the plurality of first second conductivity type impurity implantation layers. A plurality of second second conductivity type impurity implantation layers are formed in a surface of the epitaxial layer. A second trench is formed between a second non-implantation region and one of the plurality of second second conductivity type impurity implantation layers. A third semiconductor layer of the first conductivity type is formed and covers the plurality of second second conductivity type impurity implantation layers.

12 Claims, 8 Drawing Sheets

(51) Int. Cl.
*H01L 29/78* (2006.01)
*H01L 29/08* (2006.01)
*H01L 29/10* (2006.01)

(52) U.S. Cl.
CPC ...... *H01L29/66719* (2013.01); *H01L 29/7802* (2013.01); *H01L 29/7811* (2013.01); *H01L 29/0878* (2013.01); *H01L 29/1095* (2013.01)

(56) References Cited

U.S. PATENT DOCUMENTS

| | | | |
|---|---|---|---|
| 6,995,426 B2 | 2/2006 | Okumura et al. | |
| 7,391,077 B2 | 6/2008 | Tokano et al. | |
| 7,576,393 B2 | 8/2009 | Ono et al. | |
| 8,263,450 B2 | 9/2012 | Sedlmaier et al. | |
| 8,390,060 B2 | 3/2013 | Darwish et al. | |
| 8,487,374 B2 | 7/2013 | Ohta et al. | |
| 2002/0008258 A1 | 1/2002 | Baba | |
| 2003/0148559 A1* | 8/2003 | Onishi et al. | 438/138 |
| 2003/0207536 A1 | 11/2003 | Miyasaka et al. | |
| 2003/0222327 A1 | 12/2003 | Yamaguchi et al. | |
| 2004/0043565 A1 | 3/2004 | Yamaguchi et al. | |
| 2005/0098826 A1 | 5/2005 | Yamaguchi et al. | |
| 2005/0121704 A1* | 6/2005 | Tokano et al. | 257/288 |
| 2006/0043478 A1 | 3/2006 | Yamaguchi et al. | |
| 2007/0108513 A1 | 5/2007 | Rub et al. | |
| 2007/0132012 A1* | 6/2007 | Saito | 257/327 |
| 2007/0272979 A1 | 11/2007 | Saito et al. | |
| 2008/0038850 A1 | 2/2008 | Yamaguchi et al. | |
| 2008/0290403 A1* | 11/2008 | Ono et al. | 257/329 |
| 2009/0159969 A1* | 6/2009 | Lorenti et al. | 257/337 |
| 2009/0321819 A1 | 12/2009 | Kagata et al. | |
| 2010/0123186 A1 | 5/2010 | Ohta et al. | |
| 2011/0049615 A1 | 3/2011 | Saito et al. | |
| 2012/0018856 A1 | 1/2012 | Weyers et al. | |
| 2012/0286355 A1* | 11/2012 | Mauder et al. | 257/330 |

FOREIGN PATENT DOCUMENTS

| | | |
|---|---|---|
| JP | 2000252297 A | 9/2000 |
| JP | 2001298189 A | 10/2001 |
| JP | 2003258252 A | 9/2003 |
| JP | 2006073615 A | 3/2006 |
| JP | 2007012858 A | 1/2007 |
| JP | 2007103747 A | 4/2007 |
| JP | 2008047602 A | 2/2008 |
| JP | 2010123789 A | 6/2010 |
| JP | 2011049257 A | 3/2011 |

OTHER PUBLICATIONS

Korean Office Action dated Sep. 30, 2013, filed in Korean counterpart Application No. 10-2012-0095730, 6 pages (with translation).

* cited by examiner

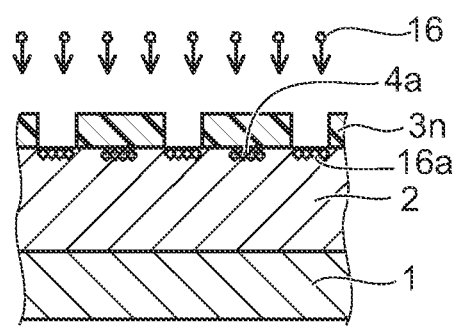
FIG. 5A
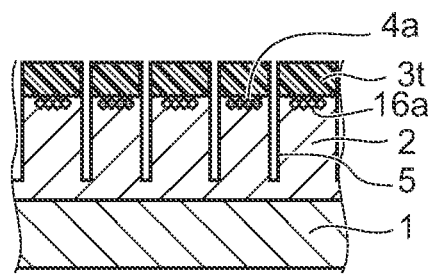
FIG. 5B
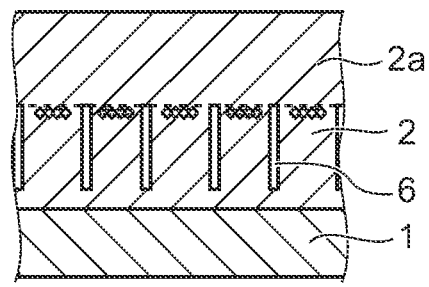
FIG. 5C
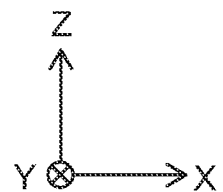

ELECTRIC POWER SEMICONDUCTOR DEVICE AND MANUFACTURING METHOD OF THE SAME

CROSS-REFERENCE TO RELATED APPLICATION

This application is a division of U.S. patent application Ser. No. 13/600,616, filed on Aug. 31, 2012, which is based upon and claims the benefit of priority from the prior Japanese Patent Application No. 2012-040208, filed on Feb. 27, 2012; the entire contents of each of which are incorporated herein by reference.

FIELD

Embodiments described herein relate generally to a electric power semiconductor device and manufacturing method of the same.

BACKGROUND

An on resistance of a vertical type power metal oxide semiconductor field effect transistor (MOSFET) depends greatly on an electric resistance of a drift layer. A concentration of an impurity which decides the electric resistance of the drift layer can not be raised up to a critical limit in correspondence to a breakdown voltage of a p-n junction which a base layer and the drift layer form. In accordance with this, a tradeoff relationship exists between the element breakdown voltage and the on resistance. It is important for decreasing an electric power consumption of the MOSFET to improve the tradeoff relationship. The tradeoff relationship has a critical limit which is decided by an element material. In order to decrease the on resistance of the MOSFET further, it is necessary to go beyond this critical limit.

As one means which goes beyond this critical limit, a configuration called as a super junction is employed in the drift layer. The super junction configuration is a configuration in which a p type pillar layer and an n type pillar layer are periodically arranged in a horizontal direction. The super junction configuration can artificially come to a non-doped layer by making charge amounts (amounts of impurities) included in the p type pillar layer and the n type pillar layer equal. As a result, since the drift layer can have the p type pillar layer and the n type pillar layer which have the high impurity concentration while retaining a high breakdown voltage, the MOSFET can have a low on resistance which goes beyond a material limit.

As one example of a method of forming the super junction configuration, there is a multi epitaxial process in which an ion injection into a semiconductor layer and a crystal growth embedding the semiconductor layer are repeated. In general, in the super junction configuration, since it is possible to increase each of the concentrations of the impurities in the p type pillar layer and the n type pillar layer by narrowing a cycle in a transverse direction of the super junction configuration, it is possible to reduce the on resistance. However, in the multi epitaxial process, since the p type pillar layer and the n type pillar layer are formed on the basis of a diffusion of the impurities, it is necessary to make a thickness of a crystal growth layer in one embedding crystal growth thin so as to make the cycle in the transverse direction of the super junction configuration short while maintaining the breakdown voltage of the MOSFET constant. Therefore, a frequency of the embedding crystal growth in the multi epitaxial process is increased.

BRIEF DESCRIPTION OF THE DRAWINGS

FIGS. 5A to 5C are schematic cross sectional views of a substantial part and show a part of a manufacturing process of the electric power semiconductor device according to the third embodiment.

DETAILED DESCRIPTION

Figure 1:
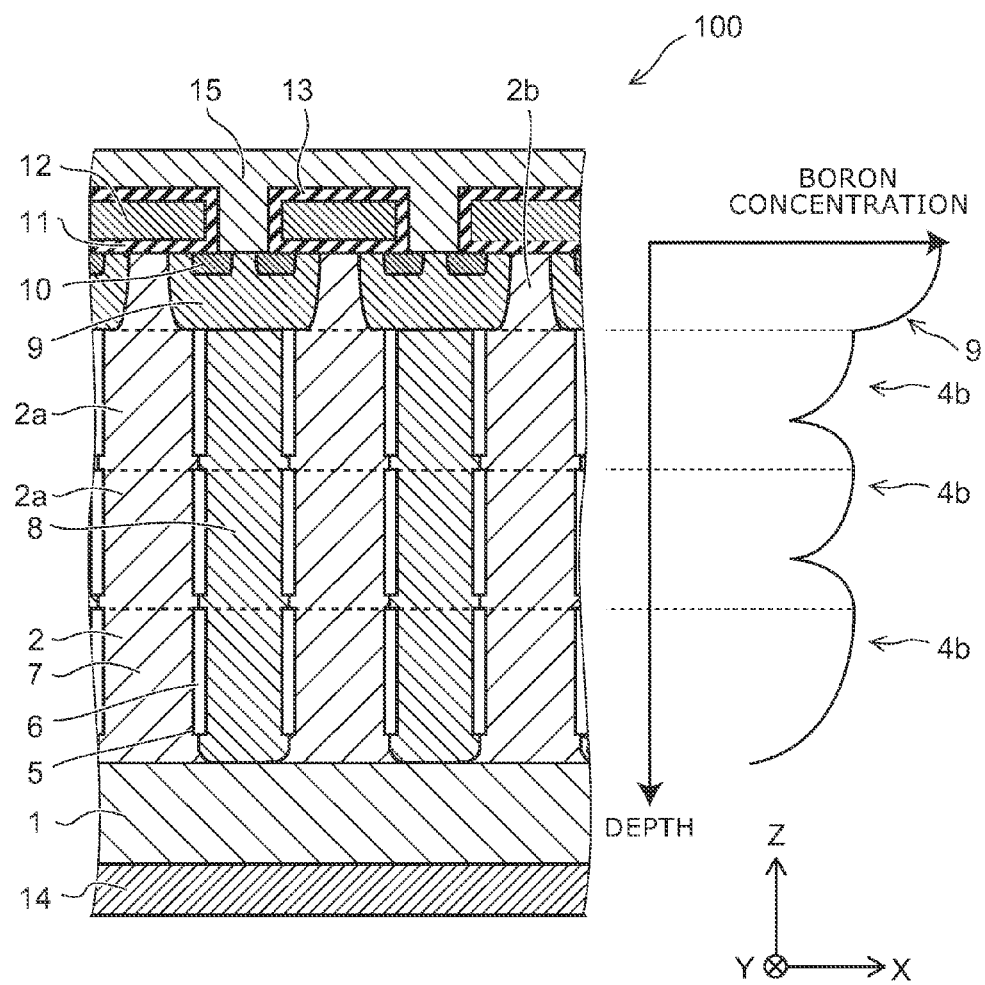
FIG. 1 is a schematic cross sectional view of a substantial part of the electric power semiconductor device according to a first embodiment.

A manufacturing method of an electric power semiconductor device includes forming a plurality of first second conductivity type impurity implantation layers, forming a first trench, forming an epitaxial layer of a first conductivity type, forming a plurality of second second conductivity type impurity implantation layers, forming a second trench, forming a third semiconductor layer of the first conductivity type, diffusing the second conductivity type impurities, forming a fourth semiconductor layer of the second conductivity type, forming a fifth semiconductor layer of the first conductivity type, forming a gate electrode, forming a first electrode, and forming a second electrode.

In the forming a plurality of first second conductivity type impurity implantation layers, an impurity of a second conductivity type is injected into a surface of a second semiconductor layer of a first conductivity type which is provided on a first semiconductor layer of the first conductivity type and has a lower concentration of the impurity of the first conductivity type than the first semiconductor layer. And then, a plurality of first second conductivity type impurity implantation layers are formed and spaced from each other along a first direction in the surface of the second semiconductor layer.

In the forming a first trench, a first trench is formed between a first non-implantation region and one of adjacent first second conductivity type impurity implantation layers in the plurality of first second conductivity type impurity implantation layers, from the surface of the second semiconductor layer into the second semiconductor layer. The first non-implantation region is a portion of the second semiconductor layer which is pinched between the adjacent first second conductivity type impurity implantation layers.

In the forming an epitaxial layer of a first conductivity type, an epitaxial layer of the first conductivity type is formed. The epitaxial layer has a lower concentration of the impurity of the first conductivity type than the first semiconductor layer and covers the plurality of first second conductivity type impurity implantation layers, the first non-implantation region, and the first trench from above.

In the forming a plurality of second second conductivity type impurity implantation layers, an impurity of the second conductivity type is injected into a surface of the epitaxial layer just above the plurality of first second conductive impurity implantation layers, and then a plurality of second second conductivity type impurity implantation layers are formed and spaced from each other along the first direction in the surface of the epitaxial layer.

In the forming a second trench, a second trench is formed between a second non-implantation region and one of adjacent second second conductivity type impurity implantation layers in the plurality of second second conductivity type impurity implantation layers, from the surface of the epitaxial layer into the epitaxial layer. The second non-implantation region is a portion of the epitaxial layer pinched between the adjacent second second conductivity type impurity implantation layers.

In the forming a third semiconductor layer of the first conductivity type, a third semiconductor layer of the first conductivity type is formed. The third semiconductor layer has a lower concentration of the impurity of the first conductivity type than the first semiconductor layer and covers the plurality of second second conductivity type impurity implantation layers, the second non-implantation region, and the second trench from above, on the basis of an epitaxial growth.

In the diffusing the second conductivity type impurities, the second conductivity type impurities are diffused in the first second conductivity type impurity implantation layer and the second second conductivity type impurity implantation layer by applying a heat treatment. And then, a first second conductive impurity diffusion layer is formed from the first second conductive impurity implantation layer. A second second conductivity type impurity diffusion layer is formed from the second second conductivity type impurity implantation layer. The first second conductivity type impurity diffusion layer and the second second conductivity type impurity diffusion layer are coupled.

In the forming a fourth semiconductor layer of the second conductivity type, a fourth semiconductor layer of the second conductivity type is formed in the third semiconductor layer and is electrically connected to the second second conductivity type impurity diffusion layer.

In the forming a fifth semiconductor layer of the first conductivity type, a fifth semiconductor layer of the first conductivity type is provided selectively in the fourth semiconductor layer. The fifth semiconductor layer has a higher concentration of the impurity of the first conductivity type than the third semiconductor layer.

In the forming a gate electrode, a gate electrode is provided on the third semiconductor layer, on the fourth semiconductor layer, and on the fifth semiconductor layer via a gate insulating film.

In the forming a first electrode, a first electrode is formed and electrically connected to the first semiconductor layer.

In the forming a second electrode, a second electrode is formed and electrically connected to the fourth semiconductor layer and the fifth semiconductor layer.

A description will be given below of an embodiment of the invention with reference to the accompanying drawings. The drawings which are used in the description in the embodiment is a schematic one for easily describing, and shapes, dimensions, size relations and the like of respective elements in the drawings are not necessarily limited to illustrated ones in the embodiment, and can be appropriately changed within a scope in which an effect of the invention can be obtained. A description will be given by setting a first conductivity type to an n type and setting a second conductivity type to a p type, however, they can be respectively set to reverse conductivity types. A description will be given by exemplifying a silicon as a semiconductor, however, the semiconductor can be applied to a compound semiconductor such as a SiC, a GaN or the like. A description will be given by exemplifying a silicon oxide as an insulating film, however, it is possible to employ the other insulating material such as a silicon nitride, a silicon oxynitride or the like. In the case that the conductivity type of the n type is expressed by $n^+$, n and $n^-$, it is assumed that a concentration of an n type impurity is lower in this order. In the same manner in the p type, it is assumed that a concentration of a p type impurity is lower in the order of $p^+$, p and $p^-$. The n type impurity concentration and the p type impurity concentration express actual concentrations of the impurities unless otherwise stated, and does not mean a concentration after compensation of the n type impurity and the p type impurity. On the contrary, a net n type impurity concentration means the n type impurity concentration after the compensation with the p type impurity. A net p type impurity concentration means the p type impurity concentration after the compensation with the n type impurity.

First Embodiment

A description will be given of an electric power semiconductor device 100 according to a first embodiment of the invention and a manufacturing method of the same with reference to FIG. 1 and FIGS. 2A to 2H. The electric power semiconductor device according to the embodiment is a MOSFET. FIG. 1 is a schematic cross sectional view of a substantial part of the electric power semiconductor device 100 according to the first embodiment. FIGS. 2A to 2H are schematic cross sectional views of a substantial part and show a part of a manufacturing process of the electric power semiconductor device according to the first embodiment.

As shown in FIG. 1, the electric power semiconductor device 100 according to the embodiment includes an $n^+$ type drain layer (a first semiconductor layer of a first conductivity type) 1, a plurality of p type pillar layers 8 (pillar layers of a second conductivity type), a plurality of n type pillar layers 7 (pillar layers of the first conductivity type), a trench 5, an n type element forming layer (a third semiconductor layer of the first conductivity type) 2b, a p type base layer 9 (a fourth semiconductor layer of the second conductivity type), an $n^+$ type source layer 10 (a fifth semiconductor layer of the first conductivity type), a gate insulating film 11, a gate electrode 12, an interlayer insulating film 13, a drain electrode 14 (a first electrode), and a source electrode 15 (a second electrode).

N type semiconductor layers 2 and 2a (second semiconductor layers of the first conductivity type) are provided on the $n^+$ type drain layer 1. A plurality of p type pillar layers 8 extend into the n type semiconductor layers 2 and 2a from surfaces of the n type semiconductor layers 2 and 2a toward the $n^+$ type drain layer 1, and are arranged so as to be spaced from each other along an X direction (a first direction) in FIG. 1 which is parallel to the surfaces of the n type semiconductor layers 2 and 2a. A plurality of n type pillar layers 7 are constructed by the n type semiconductor layers 2 and 2a which are pinched by a plurality of p type pillar layers. The trench 5 is pinched between one n type pillar layer 7 in a plurality of n type pillar layers 7, and the p type pillar layer 8 which is adjacent to the one n type pillar layer 7 in a plurality of p type pillar layers 8, and extends a stacking direction which is vertical to the surfaces of the n type semiconductor layers 2 and 2a.

The n type element forming layer 2b is provided on a plurality of n type pillar layers 7, on a plurality of p type pillar layers 8, and on the trench 5. The p type base layer 9 is provided in the n type element forming layer 2b, and is electrically connected to the p type pillar layer 8. The $n^+$ type source layer 10 is selectively provided on a surface of the p type base layer 9, and has a concentration of an n type impurity which is higher than the n type element forming layer 2b.

The $n^+$ type drain layer 1, a plurality of p type pillar layers 8, a plurality of n type pillar layers 8, the n type element forming layer 2b, the p type base layer 9, and the $n^+$ type source layer 10 are semiconductor layers which are constructed by a silicon. Further, the p type impurity is, for example, a boron, and the n type impurity is, for example, a phosphorous.

The gate electrode 12 is provided on the n type element forming layer 2b, on the p type base layer 9 and on the $n^+$ type source layer 10 via the gate insulating film 11. The gate insulating film 11 is, for example, a silicon oxide. However, an insulating material such as a silicon nitride, a silicon oxynitride or the like can be employed. The gate electrode 12 is formed, for example, of a conductive poly silicon. In the embodiment, the gate electrode 12 is of a planar type, however, can be of course set to a trench type.

The drain electrode 14 is electrically connected to the $n^+$ drain layer 1. The source electrode 15 is electrically connected to the $n^+$ type source layer 10 and the p type base layer 9. These electrodes are formed, for example, of copper, aluminum or the like.

The interlayer insulating film 13 is provided in such a manner as to cover the above of the gate electrode 12. The interlayer insulating film 13 insulates the gate electrode 12 from the source electrode 15.

A right side in FIG. 1 shows a distribution in a depth direction of a boron concentration of the p type impurity in the p type pillar layer 8 which is formed in the n type semiconductor layers 2 and 2a, and in the p type base layer 9 which is formed in the n type element forming layer 2b. In the p type pillar layer 8, the boron concentration has three maximum values in the depth direction. In other words, the p type pillar layer 8 is formed by a joint of three p type diffusion layers 4b which are formed on the basis of a diffusion of the boron in the stacking direction which is vertical to the surfaces of the n type semiconductor layers 2 and 2a.

The p type base layer 9 is formed by diffusing the boron into the n type element forming layer 2b from a surface thereof. The p type base layer 9 has a maximum value of the boron concentration on the surface of the n type element forming layer 2b, and the maximum value is larger than the maximum value of the p type impurity diffusion layer 4b in the p type pillar layer.

The trench 5 is formed between the p type pillar layer 8 and the n type pillar layer 7, however, is formed so as to be divided into a plurality of trenches 5 in the stacking direction in the embodiment. A plurality of trenches 5 are occluded in its upper end by epitaxial growing the n type semiconductor layer 2a, as described in a manufacturing method mentioned later. As a result, the trench 5 forms a cavity 6 in the n type semiconductor layers 2 and 2a. A plurality of trenches 5 which are formed in the stacking direction are spaced from each other via the n type semiconductor layer 2a.

Next, a description will be given of a manufacturing method of the electric power semiconductor device 100 according to the first embodiment with reference to FIGS. 2A to 2H.

The manufacturing method of the electric power semiconductor device 100 according to the embodiment is provided with a process of forming a plurality of first p type impurity implantation layers (first second conductivity type impurity implantation layers), a process of forming a first trench, a process of forming an n type epitaxial layer (an epitaxial layer of a first conductivity type), a process of forming a plurality of second p type impurity implantation layers (second second conductivity type impurity implantation layers), a process of forming a second trench, a process of forming an n type element forming layer (a third semiconductor layer of the first conductivity type), a diffusing process, a process of forming a p type base layer (a fourth semiconductor layer of the second conductivity type), a process of forming an $n^+$ type source layer (a fifth semiconductor layer of the first conductivity type), a process of forming a gate electrode, a process of forming a drain electrode (a first electrode), and a process of forming a source electrode (a second electrode).

Figure 2A:
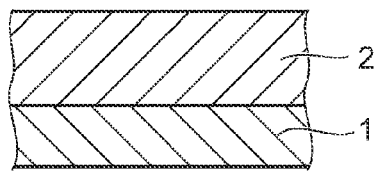
FIGS. 2A to 2H are schematic cross sectional views of a substantial part and show a part of a manufacturing process of the electric power semiconductor device according to the first embodiment.

As shown in FIG. 2A, first of all, there is prepared a semiconductor substrate in which a part 2 of an n type semiconductor layer (the n type semiconductor layers 2 and 2a are formed by being combined with plural stages of the n type epitaxial layers 2a mentioned later) is provided on the $n^+$ type drain layer 1. The semiconductor substrate can be prepared by epitaxial growing and forming the n type semiconductor layer on the $n^+$ type silicon substrate. Alternatively, a stacked configuration of the $n^+$ type drain layer and the n type semiconductor layer can be formed by diffusing the n type impurity by ion injecting the n type impurity such as the phosphorous or the like into the surface of the n type silicon substrate and thereafter applying a heat treatment. Alternatively, the stacked configuration of the n+ type drain layer and the n type semiconductor layer can be formed by epitaxial growing the n+ type semiconductor layer on the surface of the n type silicon substrate.

Figure 2B:
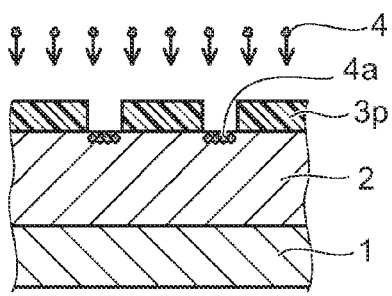

Next, as shown in FIG. 2B, there is executed the process of forming a plurality of first p type impurity injecting layers. The p type impurity 4 is selectively injected into the surface of the n type semiconductor layer 2 which is provided on the n+ type drain layer 1 and has a lower concentration of the n type impurity than the n+ type drain layer 1 by using an ion implantation. The p type impurity 4 is selectively implanted into the surface of the n type semiconductor layer 2 via a plurality of opening portions of the resist 3p, by using the boron. A plurality of opening portions of the resist 3p are arranged periodically along an X direction. As a result, a plurality of first p type impurity implantation layers 4a are formed on the surface of the n type semiconductor layer 2 so as to be spaced from each other along the X direction (the first direction) in the drawing. The cycle of a plurality of p type impurity implantation layers 4a corresponds to a cycle of the opening portions in the X direction of the resist 3p which is used for a mask, and this corresponds to a cycle of a super junction configuration. Thereafter, the resist 3p is peeled off.

Figure 2C:
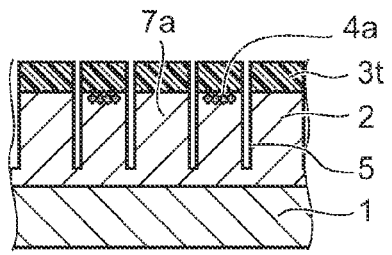

Next, as shown in FIG. 2C, the process of forming the first trench is executed. The first trench is formed between a first non-implantation region 7a and the first p type impurity implantation layer 4a, from the surface of the n type semiconductor layer 2 into the n type semiconductor layer 2. The first non-implantation region 7a is constructed by the n type semiconductor layer 2 which is pinched between the adjacent first p type impurity implantation layers 4a in a plurality of first p type impurity implantation layers 4a. The first p type impurity implantation layer 4a is one of the adjacent first p type impurity implantation layers 4a. The first trench 5 is formed in accordance with a dry etching such as a reactive ion etching (RIE) or the like, by using a resist 3t having a plurality of opening portions along the X direction. After forming the first trench 5, the resist 3t is peeled off. In this case, a cycle of a plurality of opening portions of the resist 3t is the same as a half of the cycle of a plurality of opening portions of the resist 3p.

Figure 2D:
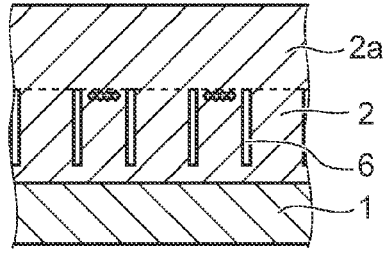

Next, as shown in FIG. 2D, the process of forming the n type epitaxial layer is executed. The n type epitaxial layer 2a is formed on the basis of the epitaxial growth in such a manner as to cover the above of a plurality of first p type impurity implantation layers 4a, the above of a plurality of first non-implantation regions 7a, and the above of a plurality of first trench 5. The n type epitaxial layer 2a has a lower concentration of the n type impurity than the $n^+$ type drain layer 1. The n type epitaxial layer 2a comes to the n type semiconductor layers 2 and 2a together with the n type semiconductor layer 2 mentioned above.

Figure 2E:
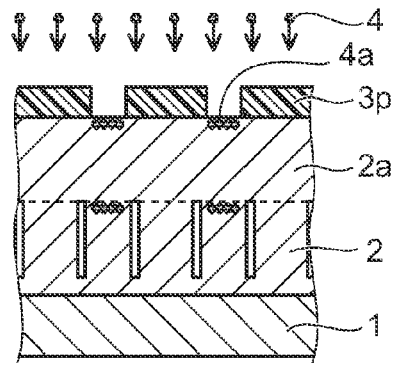

Next, as shown in FIG. 2E, the process of forming a plurality of second p type impurity implantation layers 4a is executed. A plurality of second p type impurity implantation layers 4a are formed by the selective implantation of the p type impurity 4 into the surface of the n type epitaxial layer 2a by using the ion implantation. The p type impurity 4 is implanted into the surface of the n type epitaxial layer 2a by using the resist 3p having the opening portion which is formed at the same cycle as in the forming of the first p type impurity implantation layer 4a as a mask. A plurality of second p type impurity implantation layers 4a are formed on the surface of the n type epitaxial layer 2a in such a manner as to be spaced from each other along the X direction, just above a plurality of first p type impurity implantation layers 4a. Thereafter, the resist 3p is peeled off.

Figure 2F:
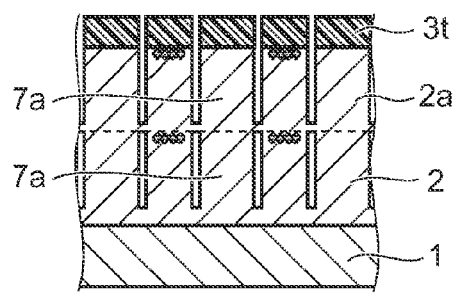

Next, as shown in FIG. 2F, the process of forming the second trench is executed. The second trench 5 is formed from the surface of the epitaxial layer 2a into the epitaxial layer 2a in such a manner as to be arranged between the second non-implantation region 7a and the second p type impurity implantation layer 4a, just above the first trench 5. The second non-implantation region 7a is constructed by the epitaxial layer 2a which is pinched between the adjacent second p type impurity implantation layers 4a in a plurality of second p type impurity implantation layers 4a. The second p type impurity implantation layer 4a is one of the adjacent second p type impurity implantation layers 4a. The second trench 5 is formed in accordance with a dry etching such as a reactive ion etching (RIE) or the like, by using the resist 3t having the opening portion of the same cycle as in the forming of the first trench as a mask. In the embodiment, the second trench 5 is formed in such a manner not to reach the first trench 5 which is formed in a lower portion thereof. In other words, a depth of the second trench 5 is smaller than a film thickness of the n type epitaxial layer 2a. The second trench 5 does not pass through the n type epitaxial layer 2a. In this case, as mentioned later, the second trench 5 can be formed in such a manner as to reach the first trench 5. After forming the second trench 5, the resist 3t is peeled off.

Figure 2G:
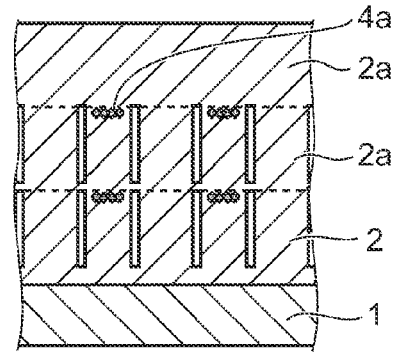

Next, as shown in FIG. 2G, the process of forming the n type epitaxial layer is again executed in the same manner as FIG. 2D. The n type epitaxial layer 2a is formed in accordance with the epitaxial growth in such a manner as to cover the above of a plurality of second p type impurity implantation layers 4a, the above of a plurality of second non-implantation regions 7a, and the above of a plurality of second trenches 5. Thereafter, in the same manner as FIG. 2E, the process of forming a plurality of second p type impurity implantation layers 4a is executed, and a plurality of second p type impurity implantation layers 4a are formed on the surface of the n type epitaxial layer 2a. Further, in the same manner as FIG. 2F, the process of forming the second trench is executed, and the second trench 5 is formed from the surface of the epitaxial layer 2a into the epitaxial layer 2a, in such a manner as to be arranged between the second non-implantation region 7a and the second p type impurity implantation layer 4a, just above the first trench 5.

Figure 2H:
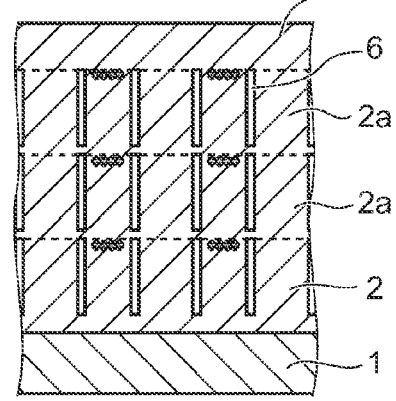

In other words, there are repeatedly executed the works of the process of forming the n type epitaxial layer in FIG. 2D, the process of forming a plurality of second p type impurity implantation layers 4a in FIG. 2E, and the process of forming the second trench in FIG. 2F. As a result, as shown in FIG. 2H, the n type epitaxial layers 2a are stacked in plural stages, and the n type semiconductor layers 2 and 2a are configured together with the n type semiconductor layer 2 which is formed in FIG. 2A. Further, the p type impurity implantation layer 4a is formed in the n type semiconductor layers 2 and 2a in each of the stages, and three stages are formed in the case of the embodiment. It is necessary to increase the number of the stages of the p type impurity implantation layers 4a in accordance with a breakdown voltage of the electric power semiconductor device is made higher. In this case, the processes in FIGS. 2D, 2E and 2F are repeated as occasion demands.

Next, as shown in FIG. 2H, the process of forming the n type element forming layer is executed. The n type element forming layer 2b is formed on the basis of the epitaxial growth in such a manner as to cover the above of a plurality of second p type impurity implantation layers 4a, the above of a plurality of second non-implantation regions 7a and the above of a plurality of second trenches 5. The n type element forming layer 2b has a lower concentration of the n type impurity than the $n^+$ type drain layer 1. In the embodiment, a description will be given on the assumption that the n type semiconductor layer 2, the n type epitaxial layer 2a and the n type element forming layer 2b have the same n type impurity concentration. However, the concentrations of these layers of n type impurities can be set desired concentrations in correspondence to various embodiments.

Thereafter, the diffusing process is executed, although an illustration will be omitted. It diffuses the p type impurities in the first p type impurity implantation layer 4a and in the second p type impurity implantation layers 4a which are formed in the plural stages in the stacking direction by applying a heat treatment. As a result, the first p type impurity diffusion layer 4b is formed from the first p type impurity implantation layer 4a, and the second p type impurity diffusion layer 4b is formed from the second p type impurity implantation layer 4a. The first p type impurity diffusion layer 4b and the second p type impurity diffusion layer 4b are coupled. In the same manner, the plural stages of second p type impurity diffusion layers 4b are coupled to each other. As a result, as shown in FIG. 1, the p type pillar layer 8 is formed such that the p type impurity diffusion layers 4b are coupled, as shown by a boron concentration profile in FIG. 1.

Further, the n type pillar layer 7 is formed such that the first non-implantation region 7a and the second non-implantation region 7a are coupled in the stacking direction. In other words, the n type pillar layer 7 is the n type semiconductor layers 2 and 2a which are pinched by the adjacent p type pillar layers 8.

Next, the conventional manufacturing process of the MOSFET is executed as follows. In other words, the process of forming the p type base layer 9 is executed, and the p type base layer 9 is formed in the n type element forming layer 2b so as to be electrically connected to the second p type impurity diffusion layer (that is, the p type base layer 8). The process of forming the n⁺ type source layer is executed, and the n⁺ type source layer 10 is selectively formed on the surface of the p type base layer 9. The n⁺ type source layer 10 has a higher concentration of the n type impurity than the n type element forming layer 2b.

The process of forming the gate electrode is executed, and the gate electrode 12 is formed on the n type element forming layer 2b, on the p type base layer 9 and on the n+ type source layer 10 via the gate insulating film 11. The gate insulating film 11 is, for example, a silicon oxide. However, an insulating material such as a silicon nitride, a silicon oxynitride or the like can be employed. The silicon oxide can be formed by a thermal oxidation. However, the other methods such as a chemical vapor deposition (CVD) method and the like can be employed. Further, the gate electrode 12 is formed, for example, of a conductive poly silicon.

In the process of forming the drain electrode, the drain electrode 14 is formed in such a manner as to be electrically connected to the n⁺ type drain layer 1.

In the process of forming the source electrode, the source electrode 15 is formed in such a manner as to be electrically connected to the p type base layer 9 and the n⁺ type source layer 10. Further, the source electrode 15 is formed on the gate electrode 12 via the interlayer insulating film 13.

The electric power semiconductor device 100 has the configuration as shown in FIG. 1 while passing through the above processes.

Next, a description will be given of effects obtained by the electric power semiconductor device 100 and the manufacturing method of the same according to the embodiment.

In the manufacturing method of the electric power semiconductor device 100 according to the embodiment, there are executed the process of forming a plurality of first p type impurity implantation layers, the process of forming the first trench, the process of forming the n type epitaxial layer, the process of forming a plurality of second p type impurity implantation layers, and the process of forming the second trench. On the basis of the execution of these processes, the p type impurity implantation layers 4a are stacked in the plural stages in the stacking direction in the n type semiconductor layers 2 and 2a.

Thereafter, as mentioned above, in accordance with the diffusing process, the p type impurity is diffused in a radial pattern into the n type semiconductor layers 2 and 2a from the p type impurity implantation layers 4a which are formed in the plural stages in the stacking direction, and the plural stages of p type impurity diffusion layers 4b are formed in the stacking direction. The p type impurity is further diffused in the stacking direction, whereby the plural stages of p type impurity diffusion layers 4b are coupled in the stacking direction, and a plurality of p type pillar layers 8 which are arranged in the X direction are formed. The n type semiconductor layers 2 and 2a which are pinched by the adjacent p type pillar layers come to the n type pillar layer 7.

In a horizontal direction which is parallel to the X direction, the diffusion of the p type impurity is generated in the same manner as the stacking direction. In accordance with this, in the conventional super junction configuration in which the n type pillar layer is directly adjacent to the p type pillar layer, the diffusion of the p type impurity is generated from the p type pillar layer to the n type pillar layer. As a result, in the n type pillar layer, the n type impurity in the n type pillar layer is compensated by the p type impurity which is diffused from the p type pillar layer. As a result of the compensation of the impurity, in the n type pillar layer, a net n type impurity concentration is reduced at a degree of the p type impurity concentration caused by the diffusion from the p type pillar layer in comparison with the original n type impurity concentration. Since the diffusion of the p type impurity from the p type pillar layer to the n type pillar layer is increased in accordance that the distance for diffusing the p type impurity in the stacking direction in the diffusing process is longer, the net n type impurity concentration of the n type pillar layer is reduced.

In other words, in the conventional super junction configuration and the manufacturing method of the same, in the case that a thickness in the stacking direction of the super junction is constant (that is, the case of the configuration in which the breakdown voltage is the same), the shorter the cycle in the horizontal direction of the p type pillar layer is, or the less the number of the stages of the p type impurity implantation layer 4a in the stacking direction is, the greater an influence of the diffusion from the p type pillar layer to the n type pillar layer becomes. As a result, the concentration of the p type impurity in the p type pillar layer is reduced at the degree that the p type impurity is diffused from the p type pillar layer to the n type pillar layer. Further, the net n type impurity concentration of the n type pillar layer is reduced by the diffusion of the p type impurity from the p type pillar layer. In accordance with this, since the resistance of the n type pillar layer in which an electric current flows rises, an on resistance of the electric power semiconductor device rises.

In the manufacturing method of the electric power semiconductor device 100 according to the embodiment, the trench 5 is formed between the n type semiconductor layers 2 and 2a coming to the non-implantation region 7a, and the p type impurity implantation layer 4a. In the trench 5, an upper end is occluded by the n type semiconductor layer 2a, and an inner portion comes to the cavity 6. Since the trench 5 is provided, the diffusion of the p type impurity in the direction which is parallel to the X direction from the p type impurity implantation layer 4a is suppressed in the diffusion process. In other words, the diffusion of the p type impurity from the p type impurity implantation layer 4a to the non-implantation region 7a which is adjacent via the trench 5 is blocked by the trench 5.

On the contrary, in the stacking direction, since it is possible to sufficiently diffuse the p type impurity from the p type impurity implantation layer 4a toward the adjacent p type impurity implantation layer 4a, the p type impurity diffusion layers 4b are coupled in the stacking direction, and the p type pillar layer 8 is formed.

As a result, it is possible to form the p type pillar layer 8 and the n type pillar layer 7 while hardly generating the diffusion of the p type impurity from the p type pillar layer 8 to the n type pillar layer 7. It is possible to sufficiently diffuse the p type impurity in the stacking direction, and it is possible to couple the p type impurity diffusion layers 4b which are formed in the plural stages in the stacking direction. In accordance with this, it is possible to reduce the number of the stages of the p type impurity implantation layers 4a in the stacking direction.

In other words, it is possible to reduce the frequency of repeating the process of forming the n type epitaxial layer, the process of forming a plurality of second p type impurity implantation layers, and the process of forming the second trench. Alternatively, even if the distance of the p type impurity implantation layers 4a in the X direction is narrowed, it is possible to form the p type pillar layer 8 and the n type pillar layer 7 without generating the diffusion of the p type impurity from the p type pillar layer 8 to the n type pillar layer 7 in the X direction. In other words, in accordance with the electric power semiconductor device and the manufacturing method of the same according to the embodiment, it is possible to reduce the number of the production processes of the electric power semiconductor device having the super junction configuration.

In the embodiment, the second trench 5 is formed in such a manner that it does not pass through the n type epitaxial layer 2a and does not reach the first trench 5. In other words, the trenches 5 which are formed in a lot of stages in the stacking direction are formed in such a manner as to be spaced from each other. However, they may be connected to each other. In other words, in the process of forming the second trench, the second trench may be formed in such a manner as to pass through the n type epitaxial layer 2a and be connected to the first trench.

The trenches 5 which are formed in the plural stages are spaced from each other via the n type epitaxial layer 2a. The portion (the spaced portion) in which the trenches 5 are spaced in the stacking direction is configured by the n type epitaxial layer 2a. The portion which is adjacent to the spaced portion in the p type pillar layer 8 is a center portion of a concentration distribution of the p type impurity diffusion layer 4b, and the p type impurity concentration becomes maximum. In accordance with this, the diffusion of the p type impurity is generated from the p type impurity diffusion layer 4b toward the n type pillar layer via the spaced portion of the trench 5. In accordance with this, the distance at which the trenches 5 are spaced in the stacking direction is desirably short.

Further, the n type epitaxial layer 2a in the spaced portion of a plurality of trenches 5 in the stacking direction is exposed to an internal stress caused by the trench 5. A magnitude of the internal stress becomes maximum in the case that the length of each of a plurality of trenches 5 is the same as the distance at which the adjacent trenches 5 are spaced, in the stacking direction, and becomes smaller in accordance that the spaced distance of the adjacent trenches 5 becomes smaller. Therefore, it is desirable that the spaced distance of the trenches 5 which are adjacent to each other in the stacking direction is narrower than the length in the stacking direction of a plurality of trenches 5. Alternatively, it is desirable that the second trench 5 is formed that in such a manner that the length in the stacking direction of the second trench 5 becomes longer than the distance in the stacking direction between the first trench 5 and the second trench 5, in the process of forming the second trench 5.

Further, the n type element forming layer 2b which is formed in the process of forming the n type element forming layer is formed thinner than the thickness of the n type epitaxial layer 2a which is formed in the process of forming the n type epitaxial layer. This is because the p type base layer 4 is securely bonded to the p type pillar layer 8, and the p type base layer does not expand too much in the horizontal direction.

The description is given above of the first (first stage) configuration which is provided on the n+ type drain layer 1, by using the n type semiconductor layer 2, the first p type impurity implantation layer 4a, the first p type impurity diffusion layer 4b, the first non-implantation region 7a and the first trench 5, for easily describing the embodiment. The description is given of the second stage configuration by using the n type epitaxial layer 2a, the second p type impurity implantation layer 4a, the second p type impurity diffusion layer 4b, the second non-implantation region 7a, and the second trench 5. Further, the description is given of the stacked configuration which has the p type pillar layer 8 and the n type pillar layer 7, by the repeated formations of the second stage configuration at the plural times on the first stage configuration. Same applied to the following embodiments.

Second Embodiment

Figure 3:
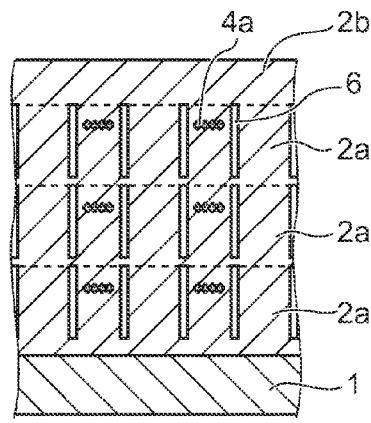
FIG. 3 is a schematic cross sectional view of a substantial part and shows a part of a manufacturing process of the electric power semiconductor device according to the second embodiment.
Figure 4:
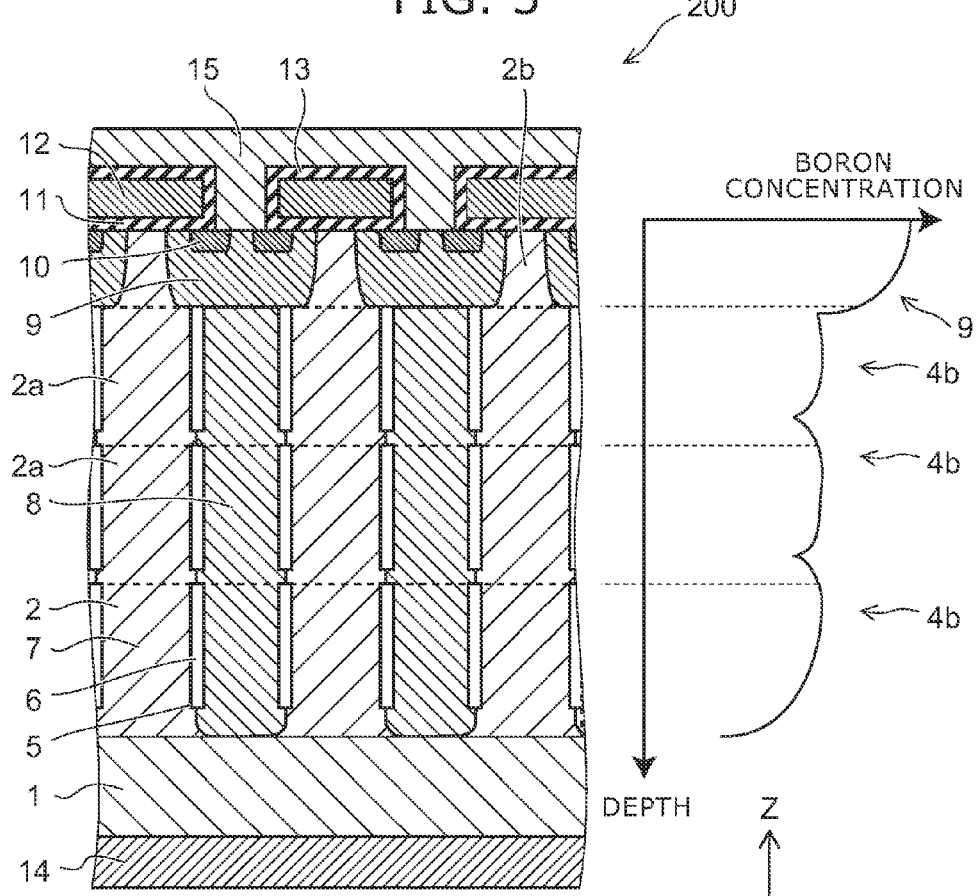
FIG. 4 is a schematic cross sectional view of a substantial part of the electric power semiconductor device according to the second embodiment.

A description will be given of an electric power semiconductor device 200 according to a second embodiment and a manufacturing method of the same with reference to FIG. 3 and FIG. 4. FIG. 3 is a schematic cross sectional view of a substantial part and shows a part of a manufacturing process of the electric power semiconductor device according to the second embodiment. FIG. 4 is a schematic cross sectional view of a substantial part of the electric power semiconductor device according to the second embodiment. In this case, the same reference numerals or reference symbols are used in portions having the same configurations as the configurations described in the first embodiment, and a description thereof will be omitted. A description will be mainly given of a different point from the first embodiment.

FIG. 3 is a cross sectional view showing a part of a manufacturing process which corresponds to FIG. 2H. In the electric power semiconductor device 200 according to the embodiment and the manufacturing method of the same, as shown in FIG. 3, a position in the stacking direction of the p type impurity implantation layer 4a which is formed in the n type epitaxial layer in each of the stages is different from the electric power semiconductor device 100 according to the first embodiment and the manufacturing method of the same. The others are the same.

The manufacturing method of the electric power semiconductor device of the embodiment is provided with a process of forming a plurality of first p type impurity implantation layers (first second conductivity type impurity implantation layers), a process of forming a first trench, a process of forming an n type epitaxial layer (an epitaxial layer of a first conductivity type), a process of forming a plurality of second p type impurity implantation layers (second second conductivity type impurity implantation layers), a process of forming a second trench, a process of forming an n type element forming layer (a third semiconductor layer of the first conductivity type), a diffusing process, a process of forming a p type base layer (a fourth semiconductor layer of the second conductivity type), a process of forming an n$^+$ type source layer (a fifth semiconductor layer of the first conductivity type), a process of forming a gate electrode, a process of forming a drain electrode (a first electrode), and a process of forming a source electrode (a second electrode), in the same manner as the manufacturing method of the electric power semiconductor device according to the first embodiment.

In the manufacturing method of the electric power semiconductor device 200 according to the embodiment, the p type impurity 4 is implanted deeper in comparison with the manufacturing method of the electric power semiconductor device 100 according to the first embodiment, at a time of selectively implanting the p type impurity 4 into the surface of the n type semiconductor layer 2 by using the ion implantation, in the process of forming the first p type impurity implantation layer. Specifically, the p type impurity 4 is implanted into the surface of the n type semiconductor layer 2 by making an acceleration voltage in the ion implantation high. As a result, the first p type impurity implantation layer 4a is formed such that a peak of the concentration distribution of the p type impurity is spaced from the surface of the n type semiconductor layer 2 toward the n$^+$ type drain layer 1.

In the process of forming the second p type impurity implantation layer, in the same manner, the p type impurity 4 is injected deeper in comparison with the manufacturing method of the electric power semiconductor device 100 according to the first embodiment, at a time of selectively implanting the p type impurity 4 into the surface of the n type epitaxial layer 2a by using the ion implantation. As a result, the second p type impurity implantation layer 4a is formed such that the peak of the concentration distribution of the p type impurity is spaced from the surface of the n type epitaxial layer 2a toward the n$^+$ type drain layer 1.

As a result of the above, in the electric power semiconductor device 200 according to the embodiment, as shown in FIG. 4, a center position of the concentration distribution of the p type impurity diffusion layer 4b is arranged closer to the n$^+$ type drain layer 1 side than the spaced portions of the trenches 5 which are adjacent to each other along the stacking direction. In other words, the center position of the concentration distribution of the p type impurity diffusion layer 4b is arranged in the side of the n$^+$ type drain layer 1 from an end of the trench 5 in the side of the n type element forming layer 2b, the trench 5 being closest to the center position. In accordance with this, in the manufacturing method of the electric power semiconductor device 200 according to the embodiment, the diffusion of the p type impurity is suppressed from the p type impurity diffusion layer 4b toward the n type pillar layer 7 via the n type epitaxial layer 2a in the spaced portions of the adjacent trenches 5, in comparison with the manufacturing method of the electric power semiconductor device 100 according to the first embodiment.

As a result, in comparison with the electric power semiconductor device 100 according to the first embodiment, the concentration of the p type impurity in the p type impurity diffusion layer 4b is high, and the concentration distribution is flattened in the stacking direction. In other words, the concentration of the p type impurity in the p type pillar layer 8 can be maintained uniformly high.

In the electric power semiconductor device 200 according to the embodiment, in the same manner as the electric power semiconductor device 100 according to the first embodiment, it is possible to form the p type pillar layer 8 and the n type pillar layer 7 while hardly generating the diffusion of the p type impurity from the p type pillar layer 8 to the n type pillar layer 7. It is possible to sufficiently diffuse the p type impurity in the stacking direction, and it is possible to couple the p type impurity diffusion layers 4b which are formed in the plural stages in the stacking direction. Then it is possible to reduce the number of the stages of the p type impurity implantation layers 4a in the stacking direction. In other words, in accordance with the electric power semiconductor device 200 according to the embodiment and the manufacturing method of the same, it is possible to reduce the number of the production processes of the electric power semiconductor device having the super junction structure.

Third Embodiment

A description will be given of an electric power semiconductor device 300 according to a third embodiment and a manufacturing method of the same with reference to FIGS. 5A to 5C. FIGS. 5A to 5C are schematic cross sectional views of a substantial part and show a part of a manufacturing process of the electric power semiconductor device according to the third embodiment. In this case, the same reference numerals or reference symbols are used in portions having the same configurations as the configurations described in the first embodiment, and a description thereof will be omitted. A description will be mainly given of a different point from the first embodiment.

The manufacturing method of the electric power semiconductor device 300 according to the embodiment is different from the manufacturing method of the electric power semiconductor device 100 according to the first embodiment in a point that it is further provided with a process of forming a plurality of first n type impurity implantation layers before executing the process of forming the first trench, and it is further provided with a process of forming a plurality of second n type impurity implantation layers before executing the process of forming the second trench, in the manufacturing method of the electric power semiconductor device 100 according to the first embodiment.

In the manufacturing method of the electric power semiconductor device 300 according to the embodiment, the process of forming a plurality of first p type impurity implantation layers is executed as shown in FIGS. 2A and 2B of the manufacturing method of the electric power semiconductor device 100 according to the first embodiment.

Thereafter, as shown in FIG. 5A, the process of forming a plurality of first n type impurity implantation layers is executed. One of a plurality of first n type impurity implantation layers 16a is formed in the first non-implantation region which is constructed by the n type semiconductor layers 2 pinched between the adjacent first p type impurity implantation layers 4a in a plurality of first p type impurity implantation layers 4a. The other first n type impurity implantation layers 16a are formed in the other first non-implantation regions 7a in the same manner. In accordance with this, a plurality of first n type impurity implantation layers 16a are formed on the surface of the n type semiconductor layer 2 between a plurality of first p type impurity implantation layers along the X direction. This is executed by selectively implanting the n type impurity 16 to the surface of the n type semiconductor layer 2 in accordance with the ion implantation, by using the resist 3n which has the opening portions corresponding to a plurality of first non-implantation regions. As the n type impurity 16, for example, the phosphorous is employed.

Thereafter, as shown in FIG. 5B, the same process as the process of forming the first trench according to the first embodiment is executed. In accordance with this, the first trench is formed between the first p type impurity implantation layer 4b and the first n type impurity implantation layer 16a. In the thereafter process, it can be thought that the first non-implantation region in the first embodiment includes the first n type impurity implantation layer.

Thereafter, as shown in FIG. 5C, the same process as the process of forming the n type epitaxial layer according to the first embodiment is executed. The n type epitaxial layer 2a is formed on the basis of the epitaxial growth in such a manner as to cover the above of a plurality of first p type impurity implantation layers 4a, the above of a plurality of first n type impurity implantation layers 16a, and the above of a plurality of first trenches 5.

Thereafter, although an illustration will be omitted, there are executed sequentially the process of forming a plurality of second p type impurity implantation layers, the process of forming the second trench, the process of forming the n type element forming layer, the diffusing process, the process of forming the p type base layer, the process of forming the n+ type source layer, the process of forming the gate electrode, the process of forming the drain electrode, and the process of forming the source electrode, in the same manner as FIGS. 2E to 2H of the manufacturing method of the electric power semiconductor device 100 according to the first embodiment.

In this case, in the same manner as the process of forming the first n type impurity implantation layer 16a, the process of forming the second n type impurity implantation layer 16a is executed before the process of forming the second trench in the same manner as that shown in FIG. 5A. In the process after the process of forming the second trench, it can be thought that the second non-implantation region in the first embodiment includes the second n type impurity implantation layer 16a. In accordance with this, the second trench 5 is formed between the second p type impurity implantation layer 4a and the second n type impurity implantation layer 16a.

Further, in the diffusing process, in the same manner that the first p type impurity implantation layer 4a and the second p type impurity implantation layer 4a respectively come to the first p type impurity diffusion layer 4b and the second p type impurity diffusion layer 4b, the first n type impurity implantation layer 16a and the second n type impurity implantation layer 16a respectively come to the first n type impurity diffusion layer 16b and the second n type impurity diffusion layer 16b. Further, in the same manner as the p type pillar layer 8, the first n type impurity diffusion layer 16b and the second n type impurity diffusion layer 16b are bonded in the stacking direction, and the n type pillar layer 7 is formed.

In the electric power semiconductor device 300 according to the embodiment, the trench 5 is formed between the n type impurity implantation layer 16a and the p type impurity implantation layer 4a. The diffusion of the n type impurity from the n type impurity diffusion layer 16b which constructs the n type pillar layer 7 to the p type pillar layer 8 is suppressed by the trench 5. Therefore, in the manufacturing method of the electric power semiconductor device 300 according to the embodiment, it is possible to form the p type pillar layer 8 and the n type pillar layer 7 while suppressing the diffusion of the n type impurity from the n type pillar layer 7 to the p type pillar layer 8 at the same time of suppressing the diffusion of the p type impurity from the p type pillar layer 8 to the n type pillar layer 7.

As a result, in the same manner as the electric power semiconductor device 100 according to the first embodiment, it is possible to sufficiently diffuse the p type impurity in the stacking direction so as to couple the p type impurity diffusion layers 4b which are formed in the plural stages in the stacking direction. At the same time, it is possible to sufficiently diffuse the n type impurity in the stacking direction so as to couple the n type impurity diffusion layers 16b which are formed in the plural stages in the stacking direction. In accordance with this, it is possible to reduce the stage numbers of the p type impurity implantation layers 4a and the n type impurity implantation layers 16a in the stacking direction. In other words, in accordance with the electric power semiconductor device 300 according to the embodiment and the manufacturing method of the same, it is possible to reduce the number of the production processes of the electric power semiconductor device having the super junction configuration.

Further, in the electric power semiconductor device 300 according to the embodiment, since the n type pillar layer 7 is configured by the n type impurity diffusion layer 16b, the n type pillar layer 7 has a further high n type impurity concentration in comparison with the electric power semiconductor device 100 according to the first embodiment. In accordance with this, it is possible to further reduce the on resistance.

Fourth Embodiment

Figure 6A:
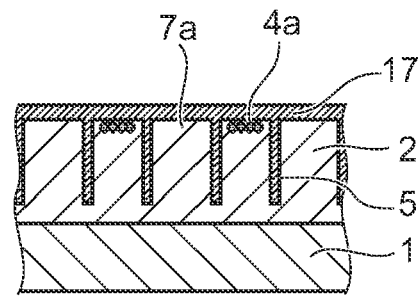
FIGS. 6A to 6C are schematic cross sectional views of a substantial part and show a part of a manufacturing process of the electric power semiconductor device according to the fourth embodiment.
Figure 6B:
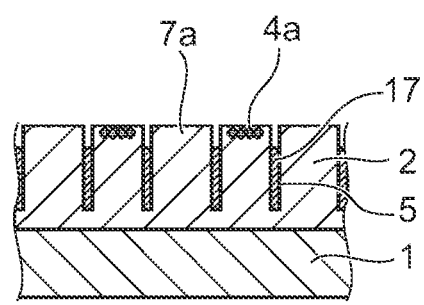
Figure 6C:
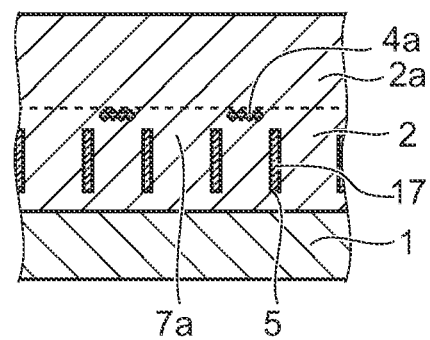

A description will be given of an electric power semiconductor device 400 according to a fourth embodiment and a manufacturing method of the same with reference to FIGS. 6A to 6C. FIGS. 6A to 6C are schematic cross sectional views of a substantial part and show a part of a manufacturing process of the electric power semiconductor device according to the fourth embodiment. In this case, the same reference numerals or reference symbols are used in portions having the same configurations as the configurations described in the first embodiment, and a description thereof will be omitted. A description will be mainly given of a different point from the first embodiment.

In the manufacturing method of the electric power semiconductor device 400 according to the embodiment, it is provided with the same manufacturing processes as the manufacturing method of the electric power semiconductor device 100 according to the first embodiment. In this case, the manufacturing method of the electric power semiconductor device 400 according to the embodiment is different from the manufacturing method of the electric power semiconductor device 100 according to the first embodiment, in a point that it is further provided with a process of embedding the first insulating film in the first trench between the process of forming the first trench and the process of forming the n type epitaxial layer, and a process of embedding the second insulating film in the second trench between the process of forming the second trench and the process of forming the n type element forming layer.

In the manufacturing method of the electric power semiconductor device 400 according to the embodiment, in the same manner as the manufacturing method of the electric power semiconductor device 100 according to the first embodiment, the process of embedding the first insulating film in the first trench, shown in FIGS. 6A and 6B is executed after executing the process of forming a plurality of first p type impurity implantation layers, and the process of forming the first trench, shown in FIGS. 2A to 2D. In this process, first of all, as shown in FIG. 6A, the first insulating film 17 is formed within the first trench formed in the n type semiconductor layer 2 and on a whole face of the n type semiconductor layer 2. As the first insulating film, for example, a silicon oxide can be employed. In addition, a silicon nitride or a silicon oxynitride can also be employed. Further, the silicon oxide is formed, for example, in accordance with a thermal oxidation. However, the silicon oxide may be formed in accordance with the CVD method or the like.

Next, as shown in FIG. 6B, a surplus first insulating film on the n type semiconductor layer 2 is removed in such a manner that the first insulating film 17 is embedded and left only within the first trench. The first insulating film 17 is removed, for example, in accordance with the RIE.

In this case, the process of forming a plurality of first p type impurity implantation layers 4a can be executed after the process of embedding the first insulating film in the first trench shown in FIGS. 6A and 6B.

Next, as shown in FIG. 6C, there is executed the process of forming the n type epitaxial layer shown in FIG. 2D of the manufacturing method of the electric power semiconductor device 100 according to the first embodiment. The n type epitaxial layer 2a is formed on the basis of the epitaxial growth in such a manner as to cover the above of a plurality of first p type impurity implantation layers 4a, the above of a plurality of first non-implantation regions 7a and the above of a plurality of first trenches 5. The first insulating film 17 is embedded within the first trench 5. Thereafter, it is thought that the first insulating film 17 is embedded within the first trench 5, and the thereafter processes are executed.

Thereafter, although an illustration will be omitted, there are executed sequentially the process of forming a plurality of second p type impurity implantation layers, the process of forming the second trench, the process of forming the n type element forming layer, the diffusing process, the process of forming the p type base layer, the process of forming the n+ type source layer, the process of forming the gate electrode, the process of forming the drain electrode, and the process of forming the source electrode, in the same manner as FIGS. 2E to 2H of the first embodiment.

In this case, in the same manner as the process of embedding the first insulating film 17 in the first trench, the process of embedding the second insulating film 17 in the second trench is provided between the process of forming the second trench and the process of forming the n type element forming layer. The process of embedding the second insulating film 17 in the second trench is executed in the same manner as that shown in FIGS. 6A and 6B. Thereafter, the process of forming the n type element forming layer is executed in the same manner as that shown in FIG. 6C. The n type element forming layer 2b is formed on the basis of the epitaxial growth in such a manner as to cover the above of a plurality of second p type impurity implantation layers 4a, the above of a plurality of second non-implantation regions 7a, and the above of a plurality of second trenches 5. The second insulating film 17 is embedded within the second trench 5. Thereafter, it is thought that the second insulating film 17 is embedded within the second trench 5, and the thereafter processes are executed.

In this case, the process of forming a plurality of second p type impurity implantation layers 4a can be executed after the process of embedding the second insulating film in the second trench.

In the electric power semiconductor device 400 according to the embodiment and the manufacturing method of the same, in the same manner as the electric power semiconductor device 100 according to the embodiment and the manufacturing method of the same, the trench 5 is formed between the n type semiconductor layers 2 and 2a which come to the non-implantation region 7a, and the p type impurity implantation layer 4a. On the basis of the existence of the trench 5, it is possible to suppress the diffusion of the p type impurity in the horizontal direction which is parallel to the X direction from the p type impurity implantation layer 4a, in the diffusion process. In other words, the diffusion of the p type impurity from the p type impurity implantation layer 4a to the adjacent non-implantation region 7a via the trench 5 is blocked by the trench 5. Further, in the electric power semiconductor device 400 according to the embodiment and the manufacturing method of the same, since the insulating film 17 is embedded within the trench 5, the diffusion of the p type impurity can be further securely blocked by the trench 5.

As a result, it is possible to form the p type pillar layer 8 and the n type pillar layer 7 while hardly generating the diffusion of the p type impurity from the p type pillar layer 8 to the n type pillar layer 7. Since it is possible to sufficiently diffuse the p type impurity in the stacking direction so as to couple the p type impurity diffusion layers 4b which are formed in the plural stages in the stacking direction, it is possible to reduce the stage number of the p type impurity implantation layers 4a in the stacking direction. In other words, in accordance with the electric power semiconductor device 400 according to the embodiment and the manufacturing method of the same, it is possible to reduce the number of the production process of the electric power semiconductor device having the super junction configuration.

Fifth Embodiment

A description will be given of an electric power semiconductor device 500 according to a fifth embodiment and a manufacturing method of the same with reference to FIG. 7.

Figure 7:
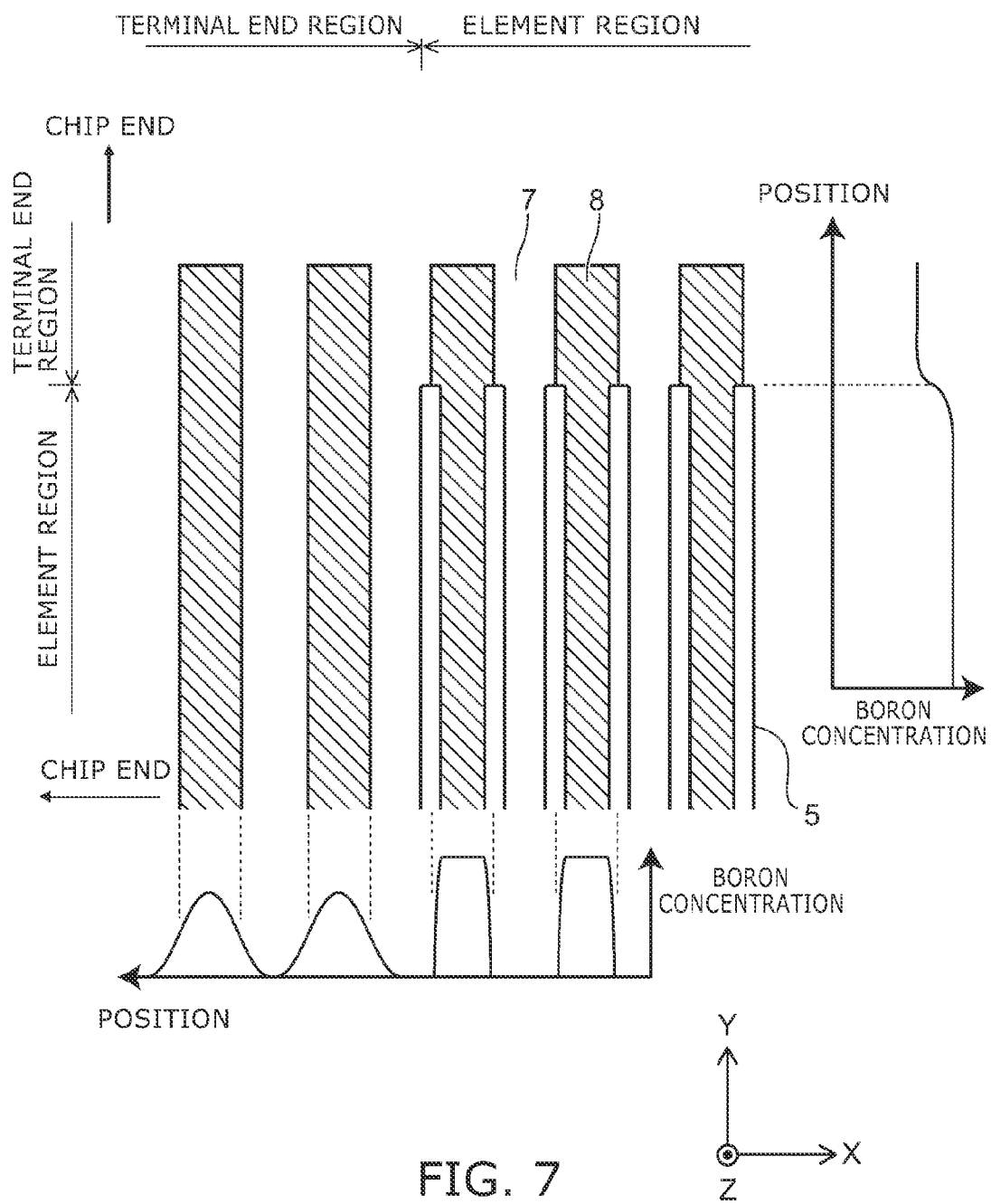
FIG. 7 is a schematic plan view of a substantial part of the electric power semiconductor device according to the fifth embodiment.

FIG. 7 is a schematic plan view of a substantial part of the electric power semiconductor device according to the fifth embodiment. In this case, the same reference numerals or reference symbols are used in portions having the same configurations as the configurations described in the first embodiment, and a description thereof will be omitted. A description will be mainly given of a different point from the first embodiment.

The manufacturing method of the electric power semiconductor device 500 according to the embodiment is provided with a process of forming a plurality of first p type impurity implantation layers, a process of forming a first trench, a process of forming an n type epitaxial layer, a process of forming a plurality second p type impurity implantation layers, a process of forming a second trench, a process of forming an n type element forming layer, a diffusing process, a process of forming a p type base layer, a process of forming an n+ type source layer, a process of forming a gate electrode, a process of forming a drain electrode, and a process of forming a source electrode, in the same manner as the manufacturing method of the electric power semiconductor device 100 according to the first embodiment.

The manufacturing method of the electric power semiconductor device 500 according to the embodiment is different from the manufacturing method of the electric power semiconductor device 100 according to the first embodiment in a point that the p type pillar layer 8, the n type pillar layer 7 and the trench 5 are formed as shown in FIG. 7. In other words, in the process of forming a plurality of first p type impurity implantation layers, a plurality of first p type impurity implantation layers are formed in such a manner as to have a stripe shape which extends in a Y direction on the surface of the n type semiconductor layer 2. In the process of forming a plurality of second p type impurity implantation layers, a plurality of second p type impurity implantation layers are formed in such a manner as to have a stripe shape which extends in the Y direction on the surface of the n type epitaxial layer 2a. In the process of forming the first trench, the first trench is formed in such a manner as to have a stripe shape which extends in the Y direction. In the process of forming the second trench, the second trench is formed in such a manner as to have a stripe shape which extends in the Y direction.

FIG. 7 shows a plan view of a substantial part in an optional horizontal surface in the n type epitaxial layer 2a which transverses the second trench, in the electric power semiconductor device 500 which has a cross section shown in FIG. 1. The plan view shows a corner portion of a rectangular semiconductor chip. The Y direction shown in FIG. 7 is an end portion side of the semiconductor chip, and a direction in an opposite side to the X direction is another end portion side which is orthogonal to the end portion mentioned above of the semiconductor chip.

The p type pillar layer 8 and the n type pillar layer 7 respectively extend along the Y direction, and are alternately arranged in the X direction which is orthogonal thereto. In the semiconductor chip, an electric current flows from the drain electrode 14 toward the source electrode 15, in an element region in which the p type base layer 9, the n+ type source layer 10 and the gate electrode 12 are formed in the element forming layer 2b. Within the horizontal face which is orthogonal to the stacking direction, a terminal end region in which the p type base layer 9, the n+ type source layer 10 and the gate electrode 12 are not formed, is formed on an outer periphery of the semiconductor chip which surrounds the element region.

The first trench and the second trench are not formed in the terminal end region, and are formed respectively in the process of forming the first trench and the process of forming the second trench, in such a manner as to be formed as a stripe shape which extends in the Y direction only in the element region.

In a right side of FIG. 7, there is shown a concentration profile of a boron which is the p type impurity along the Y direction from the element region toward the terminal end region in the p type pillar layer 8. Further, in a lower side of FIG. 7, there is shown a concentration profile of the boron along the X direction from the element region in the n type epitaxial layer 2a to the terminal end region.

In the element region in which the trench 5 is formed between the p type pillar layer 8 and the n type pillar layer 7, the diffusion of the boron from the p type pillar layer 8 to the n type pillar layer 7 is suppressed. In accordance with this, the concentration of the boron in the p type pillar layer 8 can be uniformly maintained at a high concentration in both the Y direction and the X direction.

Further, on the contrary, in the terminal end region in which the trench 5 is not formed between the p type pillar layer 8 and the n type pillar layer 7, the diffusion of the boron from the p type pillar layer 8 to the n type pillar layer is generated. In accordance with this, the concentration distribution of the boron in the p type pillar layer 8 in the terminal end region in the X direction comes to a distribution that a bottom is down to the n type pillar layer 7. Further, the concentration of the boron in the p type pillar layer 8 in the terminal end region is lowered more greatly than the concentration of the boron in the p type pillar layer 8 in the element region. In other words, in the terminal end region, the concentration of the p type impurity is lowered more greatly by the diffusion of the p type impurity, in comparison with the element region.

On the other hand, since the diffusion of the boron from the p type pillar layer 8 does not exist in the n type pillar layer 7 in the element region, the concentration of the n type impurity in the n type pillar layer 7 is uniform at the n type impurity concentration which is provided at a time of forming the n type epitaxial layer 2a. On the contrary, in the n type pillar layer 7 in the terminal end region, the boron is diffused from the p type pillar layer 8. In accordance with this, in the terminal end region, the n type impurity which is included at a time of forming the n type epitaxial layer of the n type pillar layer 7 is compensated by the boron which is diffused from the p type pillar layer 8. As a result, in the terminal end region, the net concentration of the n type impurity after the compensation of the n type pillar layer 7 is lowered more greatly than the n type impurity concentration of the n type pillar layer 7 in the element region.

As shown above, in accordance with the electric power semiconductor device 500 according to the embodiment and the manufacturing method of the same, in the terminal end region, the net p type impurity concentration of the p type pillar layer and the net n type impurity concentration of the n type pillar layer 7 are lowered, on the basis of the diffusion of the p type impurity from the p type pillar layer 8 to the n type pillar layer 7, in comparison with the element region. In the super junction configuration, the lower the net impurity concentration of the p type pillar layer and the n type pillar layer 7 is, the more a depletion layer tends to expand into the super junction, so that the breakdown voltage is improved. In accordance with this, since it is possible to improve the breakdown voltage in the terminal end region in comparison with the element region, in the electric power semiconductor device 500, an avalanche withstanding capability becomes higher.

Further, in the element region in which an electric current flows, the net p type impurity concentration and the net n type impurity concentration are equal to the p type impurity concentration and the n type impurity concentration which are originally provided, in the p type pillar layer 8 and the n type pillar layer 7. In accordance with this, it is possible to maintain the on resistance of the electric power semiconductor device 500 low.

As mentioned above, in the electric power semiconductor device 500 according to the embodiment and the manufacturing method of the same, in the same manner as the electric power semiconductor device 100 according to the first embodiment and the manufacturing method of the same, it is possible to form the p type pillar layer 8 and the n type pillar layer 7 while hardly generating the diffusion of the p type impurity from the p type pillar layer 8 to the n type pillar layer 7. It is possible to sufficiently diffuse the p type impurity in the stacking direction, and it is possible to couple the p type impurity diffusion layers 4b which are formed in the plural stages in the stacking direction. Then, it is possible to reduce the number of the stages of the p type impurity implantation layers 4a in the stacking direction. In other words, it is possible to reduce the number of the production processes of the electric power semiconductor having the super junction structure. Further, in addition, it is possible to improve the breakdown voltage in the terminal end region as well as the on resistance can be maintained low, in comparison with the electric power semiconductor device 100 according to the first embodiment and the manufacturing method of the same, as mentioned above.

Sixth Embodiment

Figure 8:
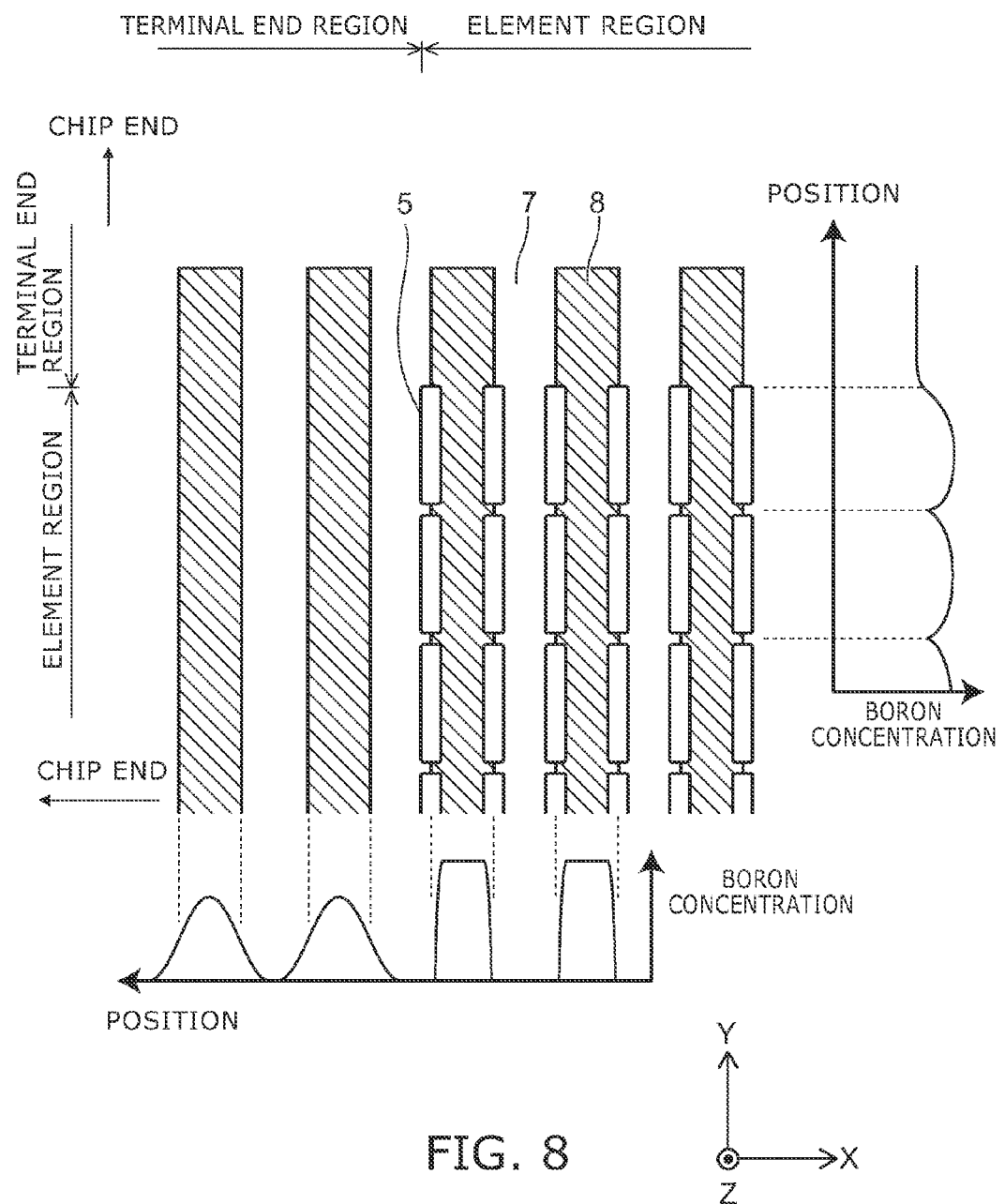
FIG. 8 is a schematic plan view of a substantial part of the electric power semiconductor device according to the sixth embodiment.

A description will be given of an electric power semiconductor device 600 according to a sixth embodiment and a manufacturing method of the same with reference to FIG. 8. FIG. 8 is a schematic plan view of a substantial part of the electric power semiconductor device according to the sixth embodiment, and corresponds to a plan view of FIG. 7 of the electric power semiconductor device 500 according to the fifth embodiment. In this case, the same reference numerals or reference symbols are used in portions having the same configurations as the configurations described in the fifth embodiment, and a description thereof will be omitted. A description will be mainly given of a different point from the fifth embodiment.

The manufacturing method of the electric power semiconductor device 600 according to the embodiment is provided with the same processes as the manufacturing method of the electric power semiconductor device 500 according to the fifth embodiment. In this case, as shown in FIG. 8, in the electric power semiconductor device 600 according to the embodiment, the first trench 5 and the second trench 5 are not the single stripe structure which extends in the Y direction, but are formed by divided portions which are divided into a plurality of sections along the Y direction so as to be spaced from each other. Further, the first trench 5 and the second trench 5 are formed in such a manner as to come to the pattern mentioned above, in the process of forming the first trench and the process of forming the second trench. The electric power semiconductor device 600 according to the embodiment and the manufacturing method of the same are different from the electric power semiconductor device 500 according to the fifth embodiment and the manufacturing method of the same, in the point mentioned above.

In the electric power semiconductor device 600 according to the embodiment and the manufacturing method of the same, it is possible to reduce the number of the production processes of the electric power semiconductor device having the super junction configuration, in the same manner as the electric power semiconductor device 500 according to the fifth embodiment and the manufacturing method of the same. Further, in comparison with the electric power semiconductor device 100 according to the first embodiment and the manufacturing method of the same, it is possible to improve the breakdown voltage in the terminal end region as well as it is possible to maintain the on resistance low.

Further, in the electric power semiconductor device 600 according to the embodiment and the manufacturing method of the same, the divided portions which are divided into a plurality of sections of the trench 5 are spaced from each other via the n type pillar layer 7 and the p type pillar layer 8 in the Y direction. Excessive holes exist in the terminal end region at a time of a recovery action at which a built-in diode which is not illustrated of the electric power semiconductor device 600 comes to an off state from an on state. The holes escape to the p type base layer 9 via between the respective divided portions in which the trench 5 is divided into a plurality of sections in the Y direction so as to be quickly discharged to the source electrode 15. In accordance with this, in the electric power semiconductor device 600 according to the embodiment, a recovery loss is reduced in comparison with the electric power semiconductor device 500 according to the fifth embodiment. Further, in the electric power semiconductor device 600, since the holes which are generated on the basis of an avalanche breakdown in the terminal end region are discharged quickly in the same manner as mentioned above, the avalanche withstanding capability is improved.

Seventh Embodiment

Figure 9:
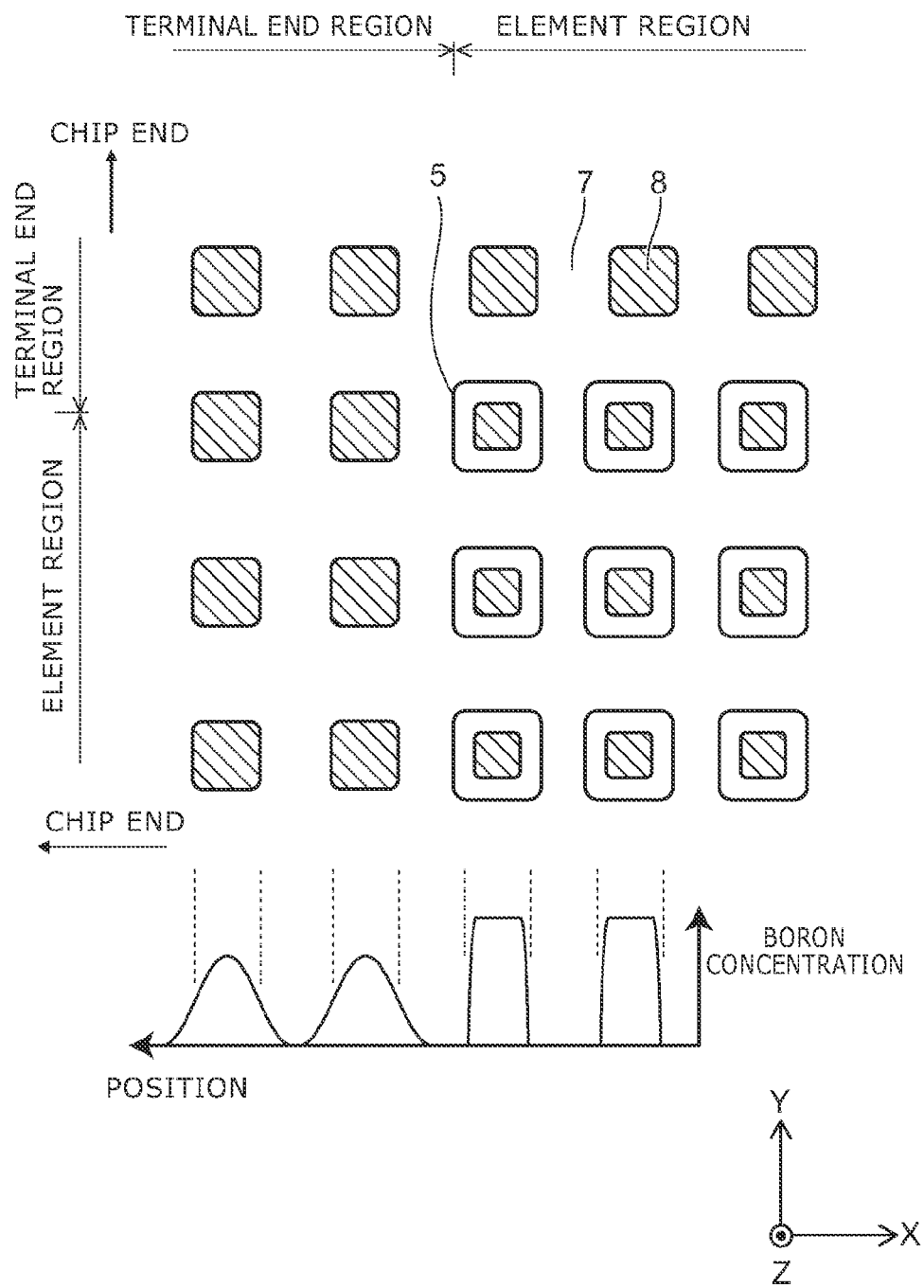
FIG. 9 is a schematic plan view of a substantial part of the electric power semiconductor device according to the seventh embodiment.

A description will be given of an electric power semiconductor device 700 according to a seventh embodiment and a manufacturing method of the same with reference to FIG. 9. FIG. 9 is a schematic plan view of a substantial part of the electric power semiconductor device according to the seventh embodiment, and corresponds to a plan view of FIG. 8 of the electric power semiconductor device 600 according to the sixth embodiment. In this case, the same reference numerals or reference symbols are used in portions having the same configurations as the configurations described in the sixth embodiment, and a description thereof will be omitted. A description will be mainly given of a different point from the sixth embodiment.

The manufacturing method of the electric power semiconductor device 600 according to the embodiment is provided with the same processes as the manufacturing method of the electric power semiconductor device 600 according to the sixth embodiment. In this case, as shown in FIG. 9, in the electric power semiconductor device 700 according to the embodiment, the plane pattern within the horizontal face of the p type pillar layer 8 which is formed in the n type semiconductor layers 2 and 2*a* is formed as a lattice shaped pattern in place of the stripe shape. Further, the trench 5 is formed so as to surround an outer periphery of the p type pillar layer 8.

Further, in the manufacturing method of the electric power semiconductor device 700 according to the embodiment, a plurality of first p type impurity implantation layers 4*a* are formed as the lattice shape on the surface of the n type semiconductor layer 2, in the process of forming a plurality of first p type impurity implantation layers. A plurality of second p type impurity implantation layers 4*a* are formed as the lattice shape on the surface of the n type epitaxial layer 2*a*, in the process of forming a plurality of second p type impurity implantation layers. In the process of forming the first trench, the first trench is formed on the surface of the n type semiconductor layer 2 in such a manner as to surround the first p type impurity implantation layer 4*a*. In the process of forming the second trench, the second trench is formed on the surface of the n type epitaxial layer 2*a* in such a manner as to surround the second p type impurity implantation layer 4*a*.

The electric power semiconductor device 700 according to the embodiment and the manufacturing method of the same are different from the electric power semiconductor device 600 according to the sixth embodiment and the manufacturing method of the same in the point mentioned above.

In the electric power semiconductor device 700 according to the embodiment, the trench is formed between the p type pillar layer 8 and the n type pillar layer 7 in the element region, and is not formed between the p type pillar layer 8 and the n type pillar layer 7 in the terminal end region. Therefore, in the electric power semiconductor device 700 according to the embodiment and the manufacturing method of the same, it is possible to obtain approximately the same effects as the electric power semiconductor device 600 according to the sixth embodiment and the manufacturing method of the same.

In this case, in the embodiment, the description is given of the case that the p type pillar layer 8 has the lattice shaped plane pattern form, however, can be formed as plane patterns such as a zigzag lattice shape, a honeycomb shape and the like.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A manufacturing method of an electric power semiconductor device comprising:

selectively injecting impurities of a second conductivity type into a surface of a second semiconductor layer of a first conductivity type, the second semiconductor layer being provided on a first semiconductor layer of the first conductivity type and having a lower concentration of impurities of the first conductivity type than the first semiconductor layer, to form a plurality of first implantation layers into which the impurities of the second conductivity type have been selectively injected, the plurality of first implantation layers being spaced from each other along the surface of the second semiconductor layer in a first direction;

forming a first trench between a first non-implantation region, which is a portion of the second semiconductor layer between an adjacent pair of first implantation layers in the plurality of first implantation layers, and one of the first implantation layers in the adjacent pair of first implantation layers, the first trench extending from the surface of the second semiconductor layer into the second semiconductor layer;

forming an epitaxial layer of the first conductivity type to cover the plurality of first implantation layers, the first non-implantation region, and the first trench, as a result of which an unfilled cavity is formed in the first trench;

selectively injecting impurities of the second conductivity type into a surface of the epitaxial layer to form a plurality of second implantation layers into which the impurities of the second conductivity type have been selectively injected, the plurality of second implantation layers being spaced from each other along the surface of the epitaxial layer in the first direction;

forming a second trench between a second non-implantation region, which is a portion of the epitaxial layer between an adjacent pair of second implantation layers in the plurality of second implantation layers, and one of the second implantation layers in the adjacent pair of second implantation layers, the second trench being above the first trench and extending from the surface of the epitaxial layer into the epitaxial layer;

forming a third semiconductor layer of the first conductivity type by epitaxial growth to cover the plurality of second implantation layers, the second non-implantation region, and the second trench, as a result of which an unfilled cavity is formed in the second trench;

applying a heat treatment to form first diffusion layers from the plurality of first implantation layers, and second diffusion layers from the plurality of second implantation layers, at least one of the first diffusion layers and at least one of the second diffusion layers being coupled to each other;

forming a fourth semiconductor layer of the second conductivity type in the third semiconductor layer, the fourth semiconductor layer being electrically connected to the at least one of the second diffusion layers;

forming a fifth semiconductor layer of the first conductivity type in the fourth semiconductor layer, the fifth semiconductor layer having a higher concentration of the impurity of the first conductivity type than the third semiconductor layer;

forming a gate electrode, via a gate insulating film, on the third semiconductor layer, on the fourth semiconductor layer, and on the fifth semiconductor layer;

forming a first electrode, which is electrically connected to the first semiconductor layer; and forming a second electrode, which is electrically connected to the fourth semiconductor layer and the fifth semiconductor layer.

2. The method according to claim 1, wherein a length of the second trench in a stacking direction which is orthogonal to the surface of the second semiconductor layer is longer than a distance in the stacking direction between the first trench and the second trench.

3. The method according to claim 1, wherein the third semiconductor layer is thinner in a stacking direction which is orthogonal to the surface of the second semiconductor layer than the epitaxial layer.

4. The method according to claim 1, wherein the first implantation layers have a concentration distribution of a second conductivity type impurity along a stacking direction which is orthogonal to the surface of the second semiconductor layer, and a peak of the concentration distribution is spaced from the surface of the second semiconductor layer toward the first semiconductor layer along the stacking direction.

5. The method according to claim 1, further comprising:
selectively injecting impurities of a first conductivity type into the first non-implantation region and forming a first first conductivity type impurity implantation layer; and
selectively injecting impurities of the first conductivity type into the second non-implantation region and forming a second first conductivity type impurity implantation layer,
wherein the heat treatment diffuses impurities of the first conductivity type in the first first conductivity type impurity implantation layer and the second first conductivity type impurity implantation layer to form a first first conductivity type impurity diffusion layer from the first first conductivity type impurity implantation layer and a second first conductivity type impurity diffusion layer from the second first conductivity type impurity implantation layer, and couples the first first conductivity type impurity diffusion layer and the second first conductivity type impurity diffusion layer.

6. The method according to 1, wherein the first trench and the second trench are formed in an element region, and are not formed in a terminal end region which surrounds the element region within a surface which is orthogonal to the stacking direction.

7. The method according to claim 6, wherein the first implantation layers have a stripe shape which extends along the surface of the second semiconductor layer in a second direction which is orthogonal to the first direction,
wherein the second implantation layers have a stripe shape which extends along the surface of the epitaxial layer in the second direction,
wherein the first trench has a stripe shape which extends in the second direction, and
wherein the second trench has a stripe shape which extends in the second direction.

8. The method according to claim 7, wherein the first trench and the second trench each comprises divided portions which are spaced from each other along the second direction.

9. The method according to claim 6, wherein the first implantation layers are formed in a lattice shape on the surface of the second semiconductor layer, and
wherein the second implantation layers are formed in a lattice shape on the surface of the epitaxial layer.

10. The method according to claim 9, wherein the first trench surrounds one of the first implantation layers on the surface of the second semiconductor, and
wherein the second trench surrounds one of the second implantation layers on the surface of the epitaxial layer.

11. A manufacturing method for a semiconductor device, comprising:
injecting impurities of a second conductivity type into a first implantation region in a second semiconductor layer of a first conductivity type, the first implantation region being adjacent in a first direction along a surface of the second semiconductor layer to a first non-implantation region of the second semiconductor layer in which impurities of the second conductivity type are not injected;
forming a first trench between the first implantation region and the first non-implantation region, the first trench extending in a second direction from the surface of the second semiconductor layer and terminating in the second semiconductor layer, the second direction intersecting the first direction;
forming a first epitaxial layer of the first conductivity type on the surface of the second semiconductor layer to cover the first implantation region, the first non-implantation region, and the first trench, as a result of which a first unfilled cavity is formed in the first trench;
injecting impurities of the second conductivity type into a second implantation region in the first epitaxial layer, the second implantation region being adjacent in the first direction along a surface of the first epitaxial layer to a second non-implantation region of the first epitaxial layer in which impurities of the second conductivity type are not injected;
forming a second trench the between the second implantation region and the second non-implantation region, the second trench extending in the second direction from the surface of the first epitaxial layer and terminating in the first epitaxial layer, the second trench and the first trench being substantially aligned along the second direction;

forming a second epitaxial layer of the first conductivity type on the surface of the epitaxial layer to cover the second implantation region, the second non-implantation region, and the second trench, as a result of which a second unfilled cavity is formed in the second trench; and heating the second semiconductor layer, in which the first unfilled cavity has been formed, and the second epitaxial layer, in which the second unfilled cavity has been formed, to diffuse impurities of the second conductivity type.

12. The method according to claim 11, wherein a length of the second unfilled cavity along the second direction is greater than a distance along the second direction from the first unfilled cavity to the second unfilled cavity.

* * * * *